US011685990B2

(12) United States Patent
Baduvamanda et al.

(10) Patent No.: US 11,685,990 B2
(45) Date of Patent: Jun. 27, 2023

(54) TEXTURED PROCESSING CHAMBER COMPONENTS AND METHODS OF MANUFACTURING SAME

(71) Applicant: APPLIED MATERIALS, INC., Santa Clara, CA (US)

(72) Inventors: Cariappa Baduvamanda, Bangalore (IN); Ong Pang Yen, Singapore (SG); Lit Ping Lam, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 308 days.

(21) Appl. No.: 15/836,391

(22) Filed: Dec. 8, 2017

(65) Prior Publication Data
US 2019/0177835 A1 Jun. 13, 2019

(51) Int. Cl.
| C23C 14/54 | (2006.01) |
| H01J 37/32 | (2006.01) |
| H01L 21/683 | (2006.01) |
| H01L 21/203 | (2006.01) |

(52) U.S. Cl.
CPC ........ *C23C 14/54* (2013.01); *H01J 37/32449* (2013.01); *H01J 37/32816* (2013.01); *H01L 21/203* (2013.01); *H01L 21/683* (2013.01)

(58) Field of Classification Search
None
See application file for complete search history.

(56) References Cited

U.S. PATENT DOCUMENTS

| 5,614,071 A * | 3/1997 | Mahvan ............... C23C 14/3407 |
| | | 204/192.12 |
| 6,506,312 B1 * | 1/2003 | Bottomfield .......... C23C 14/564 |
| | | 118/715 |
| 9,343,347 B2 | 5/2016 | Haas et al. |
| 2004/0056211 A1 * | 3/2004 | Popiolkowski ....... H01J 37/317 |
| | | 250/492.1 |
| 2006/0292310 A1 * | 12/2006 | Le .......................... C23C 16/042 |
| | | 427/446 |
| 2007/0056688 A1 * | 3/2007 | Kim .................... H01J 37/3435 |
| | | 156/293 |
| 2009/0120462 A1 | 5/2009 | West et al. |
| 2010/0247763 A1 | 9/2010 | Coutu et al. |

(Continued)

FOREIGN PATENT DOCUMENTS

| EP | 1049133 A2 | 11/2000 |
| WO | WO 2015-164263 A1 | 10/2015 |

(Continued)

OTHER PUBLICATIONS

Supplementary European Search Report for EP18887190, dated Aug. 20, 2021.

*Primary Examiner* — Ram N Kackar
(74) *Attorney, Agent, or Firm* — Moser Taboada (57) ABSTRACT

Processing chamber components and methods of manufacture of same are provided herein. In some embodiments, a component part body includes a component part body having a base plane and at least one textured surface region, wherein the at least one textured surface region comprises a plurality of independent surface features having a first side having at least a 45 degree angle with respect to the base plane. In at least some embodiments, the textured surface includes a plurality of independent surface features which are pore free.

18 Claims, 7 Drawing Sheets

(56) References Cited

U.S. PATENT DOCUMENTS

| | | | |
|---|---|---|---|
| 2011/0251698 A1* | 10/2011 | Gupta | A61F 2/34 623/23.56 |
| 2012/0258280 A1* | 10/2012 | Jackson | C23C 16/4404 428/141 |
| 2013/0102156 A1 | 4/2013 | Stevenson et al. | |
| 2014/0272341 A1 | 9/2014 | Duan et al. | |
| 2015/0001391 A1* | 1/2015 | Blake | C23C 16/4404 250/288 |
| 2016/0233060 A1* | 8/2016 | Narendrnath | H01J 37/32467 |
| 2017/0316924 A1* | 11/2017 | Cox | H01J 37/32541 |

FOREIGN PATENT DOCUMENTS

| | | |
|---|---|---|
| WO | WO 2016/126403 A1 | 8/2016 |
| WO | WO 2017-189146 A1 | 11/2017 |
| WO | WO 2018/052533 | 3/2018 |

* cited by examiner

TEXTURED PROCESSING CHAMBER COMPONENTS AND METHODS OF MANUFACTURING SAME

FIELD

Embodiments of the present disclosure relate to chamber components for equipment used in the manufacturing of semiconductor devices.

BACKGROUND

The manufacture of the sub-half micron and smaller features in the semiconductor industry rely upon a variety of processing equipment, such as physical vapor deposition chambers (PVD) and the like. The deposition chambers use RF coils to maintain a plasma in the processing chamber. Existing chamber components utilized in PVD chambers may have a high temperature differential which causes high film stress for materials that may adhere to the components during the operation of the PVD chamber. The inventors have observed higher film stress may result in flaking of the deposited material during operation of the PVD chamber after the film has reached a critical thickness. The flaking of the deposited material results in increased contamination (e.g., particles) of the interior of the PVD chamber which contributes to substrate defects, low yield, damage to the chamber component part(s), and shorter component part life spans. Thus, the high risk of contamination undesirably demands increased frequency for cleaning, maintenance, and refurbishment of the PVD chamber.

The inventors have also observed that chamber components with features such as coil spacers are difficult to manufacture using state-of-the-art metallic additive manufacturing technology such as 3-D printing because pores or cracks may form in the components during manufacturing. Pores in the components such as in component part features are problematic in reducing or diminishing the structural integrity of the feature which may lead to a shorter life span of the component part or feature.

Therefore, the inventors have provided improved processing chamber components that help reduce or prevent contamination of processing chambers and methods of manufacturing such processing chamber components.

SUMMARY

Processing chamber components and methods of manufacture of same are provided herein. In some embodiments, a component part body includes a component part body having a base plane and at least one textured surface region, wherein the at least one textured surface region comprises a plurality of independent surface features having a first side having at least a 45 degree angle with respect to the base plane. In at least some embodiments, the textured surface includes a plurality of independent surface features which are pore free.

In some embodiments, a coil spacer for a processing chamber includes: a top portion; a bottom portion; an opening disposed in the top portion and extending towards the bottom portion; an exterior surface; an interior surface disposed adjacent the opening; and a cup region disposed between the top portion and bottom portion, wherein the cup region has an exterior portion; wherein a textured surface is disposed upon the exterior portion of the cup region, and wherein the at least one textured surface region includes a plurality of independent surface features having a first side having at least a 45 degree angle with respect to the bottom portion.

In some embodiments, a method of reducing or eliminating pores in a three dimensional printed chamber component includes: (a) depositing the metal powder in an amount sufficient to form a layer having a thickness of 20-40 micrometers; (b) melting the metal powder to form a layer; and (c) repeating (a) and (b) until chamber component is fabricated substantially free of pores.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to a chamber component for a processing chamber, the chamber component, including: a component part body having a base plane and at least one textured surface region, wherein the at least one textured surface region includes a plurality of independent surface features having a first side having at least a 45 degree angle with respect to the base plane. Advantages of the present disclosure may include one or more of the following. A chamber component which can be manufactured within very tight tolerances, for example having good thickness uniformity and control. Reproducible and robust geometric features may be formed in the chamber component in portions not accessible using traditional manufacturing methods. Additive manufacturing enables complex shapes and geometries that are difficult to replicate with traditional methods of manufacturing. Additionally, the 3D printed chamber component may be manufactured faster and cheaper than other similarly shaped conventional chamber components. Moreover, the component parts may be free of pores that reduce the structural integrity of the component part and shorten the life span of the component part.

Figure 1A:
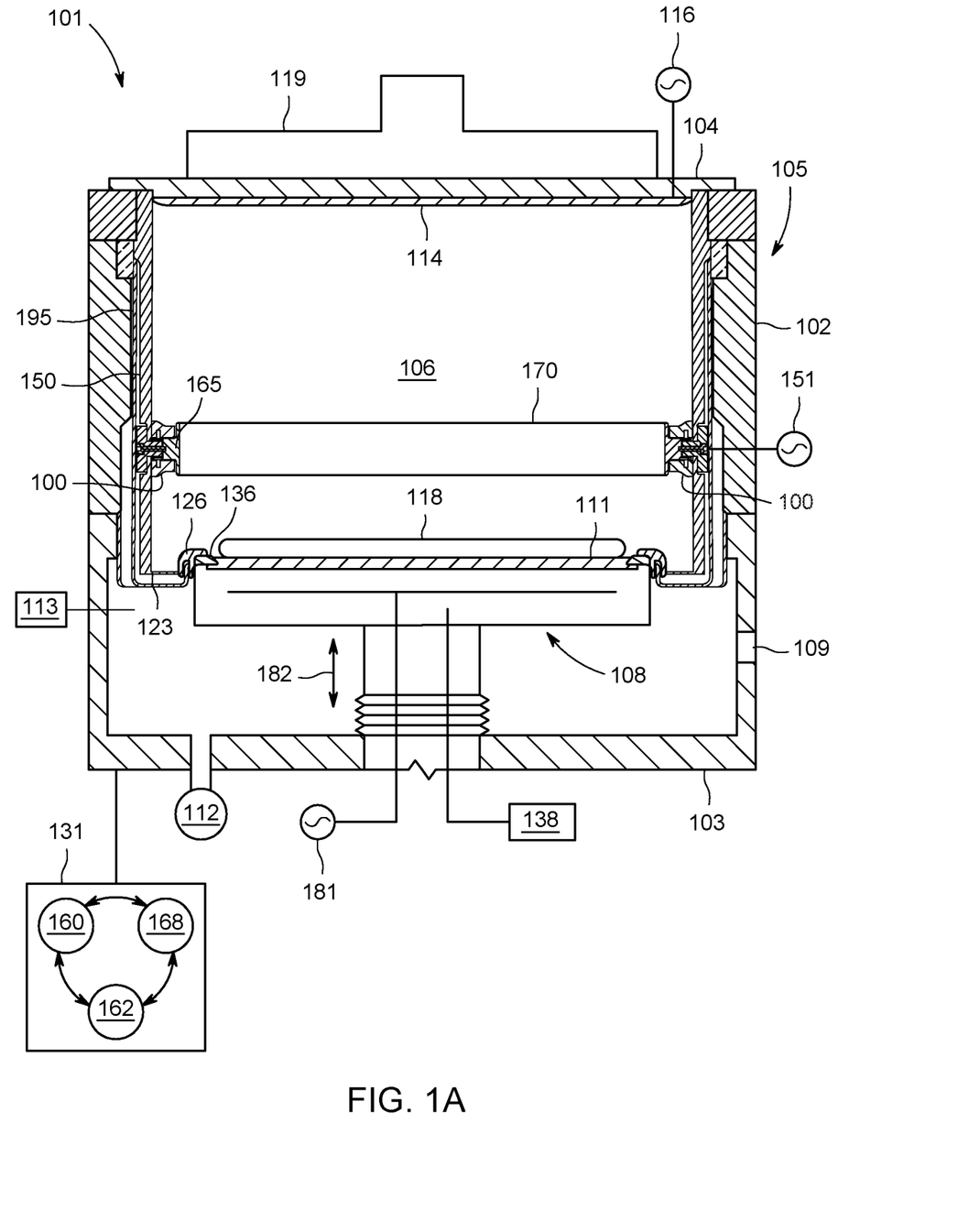
FIG. 1A depicts a schematic cross-sectional view of a process chamber having components in accordance with some embodiments of the present disclosure.

Referring now to FIG. 1A, FIG. 1A illustrates processing chamber 101 as an exemplary physical vapor deposition (PVD) chamber having components in accordance with the present disclosure as described below. Examples of suitable PVD chambers include the SIP ENCORE® PVD processing chambers, commercially available from Applied Materials, Inc., of Santa Clara, Calif. Processing chambers available from other manufactures may also be adapted to include the embodiments described herein. In one embodiment, the processing chamber 101 is capable of depositing, for example, titanium, aluminum oxide, aluminum, aluminum nitride, copper, tantalum, tantalum nitride, titanium nitride, tungsten, or tungsten nitride on a substrate 118.

The processing chamber 101 has an inductive coil 170, according to one embodiment. The processing chamber 101 has a body 105 that includes sidewalls 102, a bottom 103, and a lid 104 that encloses an interior volume 106. A substrate support, such as a pedestal 108, is disposed in the interior volume 106 of the processing chamber 101. A substrate transfer port 109 is formed in the sidewalls 102 for transferring substrates into and out of the interior volume 106.

A gas source 113 is coupled to the processing chamber 101 to supply process gases into the interior volume 106. In one embodiment, process gases may include inert gases, non-reactive gases, and reactive gases, if necessary. Examples of process gases that may be provided by the gas source 113 include, but not limited to, argon gas (Ar), helium (He), neon gas (Ne), nitrogen gas ($N_2$), oxygen gas ($O_2$), and $H_2O$ among others.

A pumping device 112 is coupled to the processing chamber 101 in communication with the interior volume 106 to control the pressure of the interior volume 106. In one embodiment, the pressure of the processing chamber 101 may be maintained at about 1 Torr or less. In another embodiment, the pressure within the processing chamber 101 may be maintained at about 500 milliTorr or less. In yet another embodiment, the pressure within the processing chamber 101 may be maintained at about 1 milliTorr and about 300 milliTorr.

The lid 104 may support a sputtering source, such as a target 114. The target 114 generally provides a source of material which will be deposited in the substrate 118. The target 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the target 114 may be fabricated by titanium (Ti) metal, tantalum metal (Ta) or aluminum (Al).

The target 114 may be coupled to a DC source power assembly 116. A magnetron 119 may be coupled adjacent to the target 114. Examples of the magnetron 119 assembly include an electromagnetic linear magnetron, a serpentine magnetron, a spiral magnetron, a double-digitated magnetron, a rectangularized spiral magnetron, among others. Alternately, powerful magnets may be placed adjacent to the target 114. The magnets may rare earth magnets such as neodymium or other suitable materials for creating a strong magnetic field. The magnetron 119 may confine the plasma as well as distributing the concentration of plasma along the target 114.

A controller 131 is coupled to the processing chamber 101. The controller 131 includes a central processing unit (CPU) 160, a memory 168, and support circuits 162. The controller 131 is utilized to control the process sequence, regulating the gas flows from the gas source 113 into the processing chamber 101 and controlling ion bombardment of the target 114. The CPU 160 may be of any form of a general purpose computer processor that can be used in an industrial setting. The software routines can be stored in the memory 168, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a computer (controller) 131 that controls the processing chamber 101 such that the processes are performed in accordance with the present disclosure. The software routines may also be stored and/or executed by a second controller (not shown) that is located remotely from the processing chamber 101.

An additional RF power source 181 may also coupled to the processing chamber 101 through the pedestal 108 to provide a bias power between the target 114 and the pedestal 108, as needed. In one embodiment, the RF power source 181 may provide power to the pedestal 108 to bias the substrate 118 at a frequency between about 1 MHz and about 100 MHz, such as about 13.56 MHz.

The pedestal 108 may be moveable between a raised position and a lowered position, as shown by arrow 182. In the lowered position, a top surface 111 of the pedestal 108 may be aligned with or just below the substrate transfer port 109 to facilitate entry and removal of the substrate 118 from the processing chamber 101. The top surface 111 may have an edge deposition ring 136 sized to receive the substrate 118 thereon while protecting the pedestal 108 from plasma and deposited material. The pedestal 108 may be moved to the raised position closer to the target 114 for processing the substrate 118 in the processing chamber 101. A cover ring 126 may engage the edge deposition ring 136 when the pedestal 108 is in the raised position. The cover ring 126 may prevent deposition material from bridging between the substrate 118 and the pedestal 108. When the pedestal 108 is in the lowered position, the cover ring 126 is suspended above the pedestal 108 and substrate 118 positioned thereon to allow for substrate transfer.

During substrate transfer, a robot blade (not shown) having the substrate 118 thereon is extended through the substrate transfer port 109. Lift pins (not shown) extend through the top surface 111 of the pedestal 108 to lift the substrate 118 from the top surface 111 of the pedestal 108, thus allowing space for the robot blade to pass between the substrate 118 and pedestal 108. The robot may then carry the substrate 118 out of the processing chamber 101 through the substrate transfer port 109. Raising and lowering of the pedestal 108 and/or the lift pins may be controlled by the controller 131.

During sputter deposition, the temperature of the substrate 118 may be controlled by utilizing a thermal controller 138 disposed in the pedestal 108. The substrate 118 may be heated to a desired temperature for processing. After processing, the substrate 118 may be rapidly cooled utilizing the thermal controller 138 disposed in the pedestal 108. The thermal controller 138 controls the temperature of the substrate 118, and may be utilized to change the temperature of the substrate 118 from a first temperature to a second temperature in a matter of seconds to about a minute.

An inner shield 150 may be positioned in the interior volume 106 between the target 114 and the pedestal 108. The inner shield 150 may be formed of aluminum or stainless steel among other materials. In one embodiment, the inner shield 150 is formed from stainless steel. An outer shield 195 may be formed between the inner shield 150 and the sidewall 102. The outer shield 195 may be formed from aluminum or stainless steel among other materials. The outer shield 195 may extend past the inner shield 150 and is configured to support the cover ring 126 when the pedestal 108 is in the lowered position.

In one embodiment, the inner shield 150 includes a radial flange 123 that includes an inner diameter that is greater than an outer diameter of the inner shield 150. The radial flange 123 extends from the inner shield 150 at an angle greater than about ninety degrees relative to the inside diameter surface of the inner shield 150. The radial flange 123 may be a circular ridge extending from the surface of the inner shield 150 and is generally adapted to mate with a recess formed in the cover ring 126 disposed on the pedestal 108. The recess may be a circular groove formed in the cover ring 126 which centers the cover ring 126 with respect to the longitudinal axis of the pedestal 108.

Figure 2:
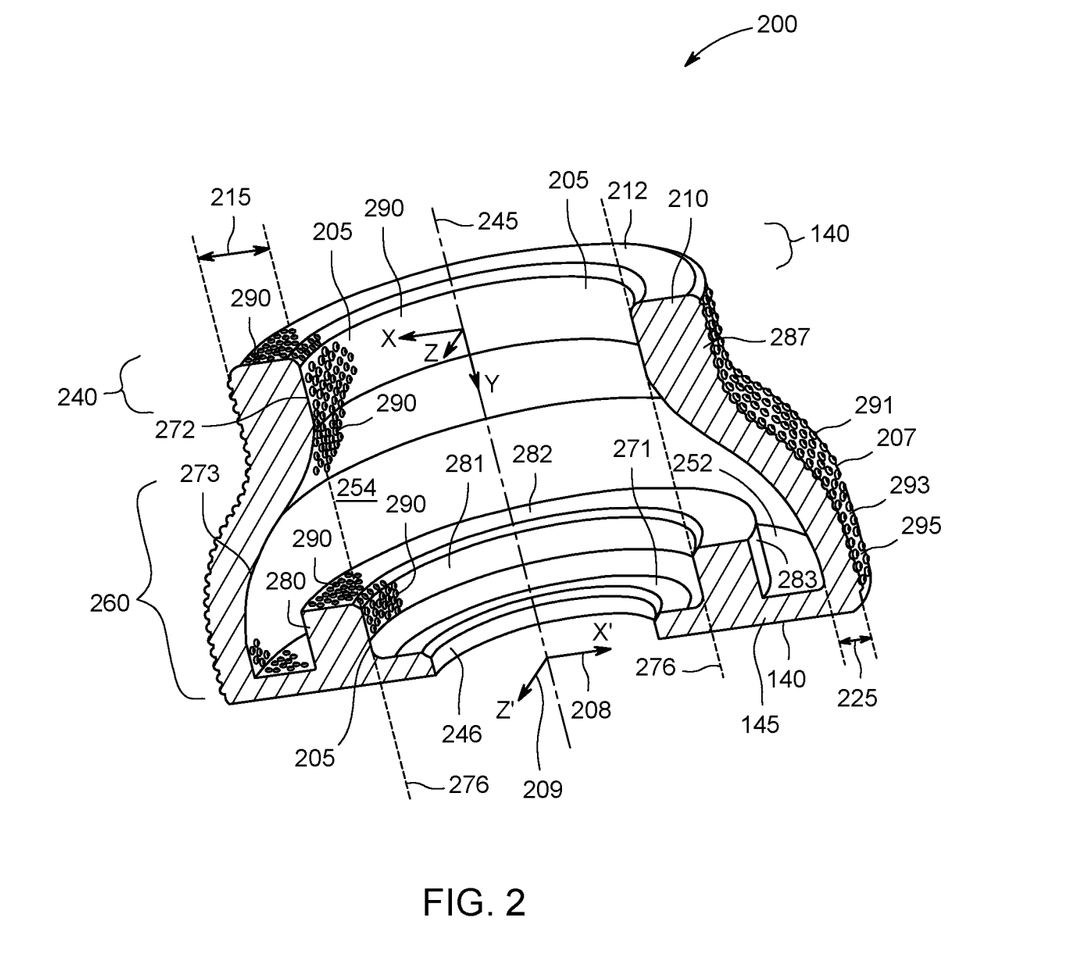
FIG. 2 depicts an isometric cross-sectional view of a coil spacer in accordance with some embodiments of the present disclosure.

The inductive coil 170 of the processing chamber 101 may be just inside the inner shield 150 and positioned above the pedestal 108. The inductive coil 170 may be positioned nearer to the pedestal 108 than the target 114. The inductive coil 170 may be formed from a material similar in composition to the target 114, such as tantalum, to act as a secondary sputtering target. The inductive coil 142 is supported from the inner shield 150 by a plurality of chamber components such as chamber component 100 which may comprise or consist of coil spacers 110 (FIG. 2). The coil spacers 110 may electrically isolate the inductive coil 170 from the inner shield 150 and other chamber components.

The inductive coil 170 may be coupled to a power source 151. The power source 151 may have electrical leads which penetrate the sidewall 102 of the processing chamber 101, the outer shield 195, the inner shield 150 and the coil spacers 110. The electrical leads connect to a tab 165 on the inductive coil 170 for providing power to the inductive coil 170. The tab 165 may have a plurality of insulated electrical connections for providing power to the inductive coil 170. Additionally, the tabs 165 may be configured to interface with the coil spacers 110 and support the inductive coil 170. The power source 151 applies current to the inductive coil 170 to induce an RF field within the processing chamber 101 and couple power to the plasma for increasing the plasma density, i.e., concentration of reactive ions.

Figure 1B:
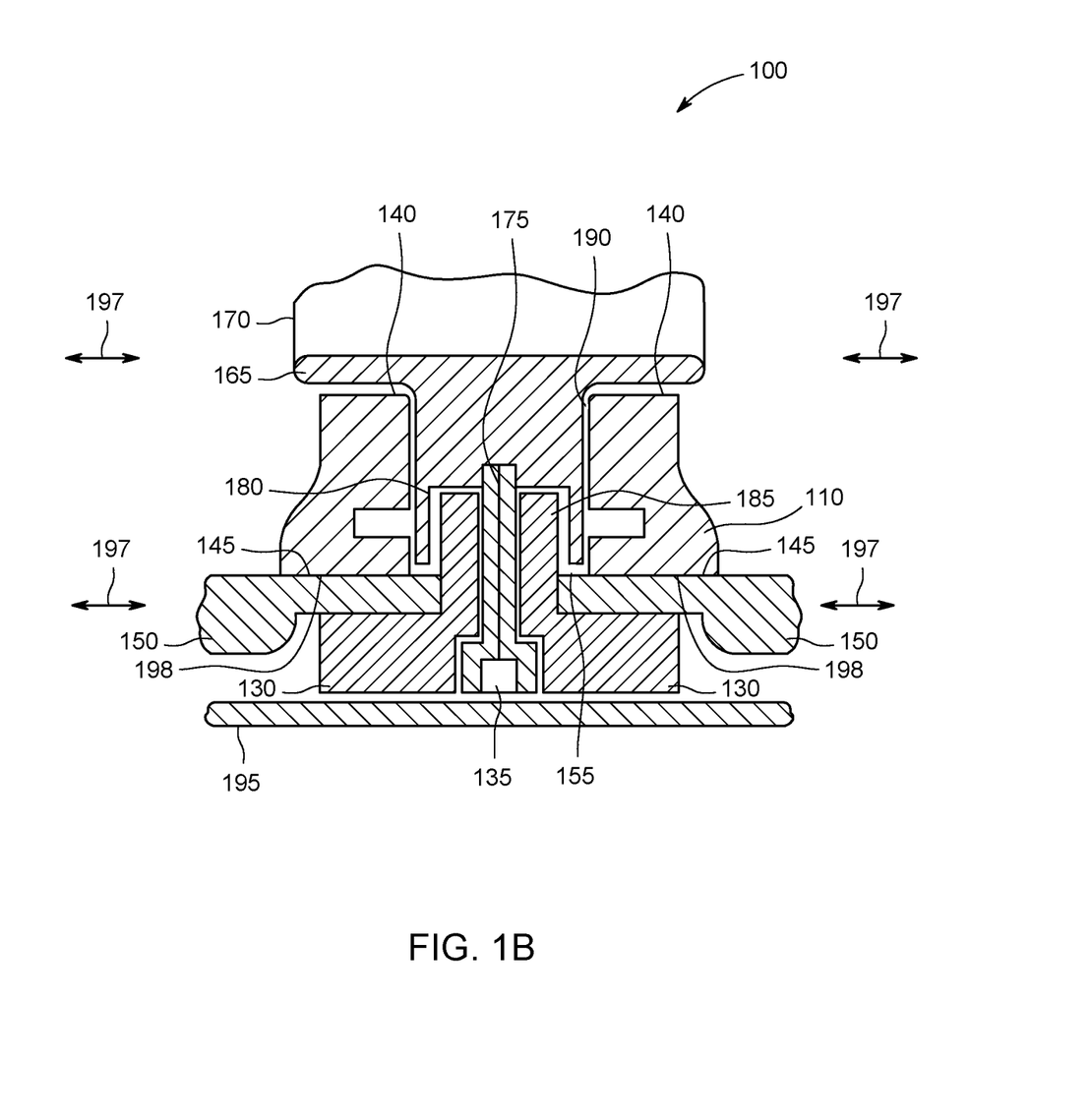
FIG. 1B depicts a cross sectional view of a coil spacer in accordance with some embodiments of the present disclosure.

FIG. 1B depicts a cross-sectional view of a chamber component 100 in accordance with the present disclosure. The chamber component 100 may include a coil spacer 110. In embodiments, the chamber component 100 includes only a coil spacer 110. The chamber component 100 may optionally include at least one tab receptor 130. A fastener 135 may be utilized to hold the tab receptor 130 and coil spacer 110 together to form chamber component 100.

The coil spacer 110 has a top portion 140 and a bottom portion 145. The bottom portion 145 may be disposed proximate the inner shield 150. The coil spacer 110, tab receptor 130 and fastener 135 may attach together to secure the coil spacer 110 to the inner shield 150. In one embodiment, the bottom portion 145 of the coil spacer 110 is disposed proximate an opening 155. In embodiments, the inner shield 150 may have a feature (not shown) which inter-fits with a complimentary feature of the coil spacer 110 to locate and/or secure the coil spacer 110 to the inner shield 150. For example, the coil spacer 110 may have threads, ferrule, taper or other structure suitable for attaching the coil spacer 110 to the inner shield 150.

The tab receptor 130 may serve as a backing or structural member for attaching the coil spacer 110 to the inner shield 150. Additionally, the tab receptor 130 or fastener 135 may interface with the tab 165 of the inductive coil 170. The tab receptor 130 may have receiving features 175 for forming a joint or connection with respective complimentary tab features 180 on the tab 165. In one embodiment, the tab features 185, 180 engage to form a structural connection between the tab 165 and the coil spacer 110 for supporting the inductive coil 170. The tab features 185, 180 may be finger joints, tapered joint, or other suitable structure for forming a union between tab 165 and the coil spacer 110 suitable for supporting the inductive coil 170. In some embodiments, the tab features 185 may form part of an electrical connection.

One or more of the coil spacers 110 may have an electrical pathway (not shown in FIG. 1B) extending there through. The electrical pathway may provide an electrical connection between the tab 165 on the inductive coil 170 and a power source (not shown) for energizing the inductive coil 170. Alternately, the coil spacers 110 may not provide an electrical pathway and the power for energizing the inductive coil 170 is provided in another manner without passing through one of the coil spacers 110. The electrical pathway may be a conductive path for transmitting an electrical signal. Alternately, the electrical pathway may be a void or space which provides accessibility of electrical connections between the power source (not shown) and the tab 165 of the inductive coil 170.

The coil spacer 110 may be formed from a metal, such as stainless steel. In embodiments, stainless steel powder having a size of 35-45 micrometers is a suitable precursor material as described further below. The coil spacer 110 may electrically isolate the inductive coil 170 from the inner shield 150. The coil spacer 110 may have an opening 190. The opening 190 may be configured to accept the tab 165. The opening 190 may be disposed in the top portion 140 and extend towards the bottom portion 145. In one embodiment, the opening 190 has a circular profile and is configured to accept tab 165 having a round shape. In another embodiment, the opening 190 is shaped to receive a tab 165 having a complimentary inter-fitting shape.

In embodiments, coil spacer 110 includes a base plane 198 in alignment with axis 197 and bottom portion 145. Base plane 198 generally extends across bottom portion 145. FIG. 1B also shows an outer shield 195 adjacent chamber component 100. While not connected with chamber component 100, outer shield 195 is shown aligned in parallel with axis 197, bottom portion 145, and base plane 198.

Figure 3:
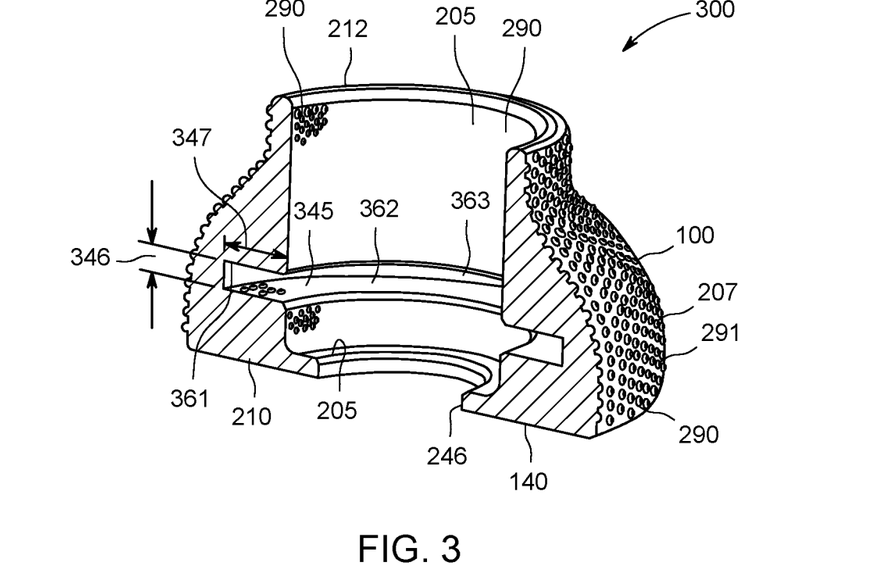
FIG. 3 depicts an isometric cross-sectional view of a coil spacer in accordance with some embodiments of the present disclosure.
Figure 4:
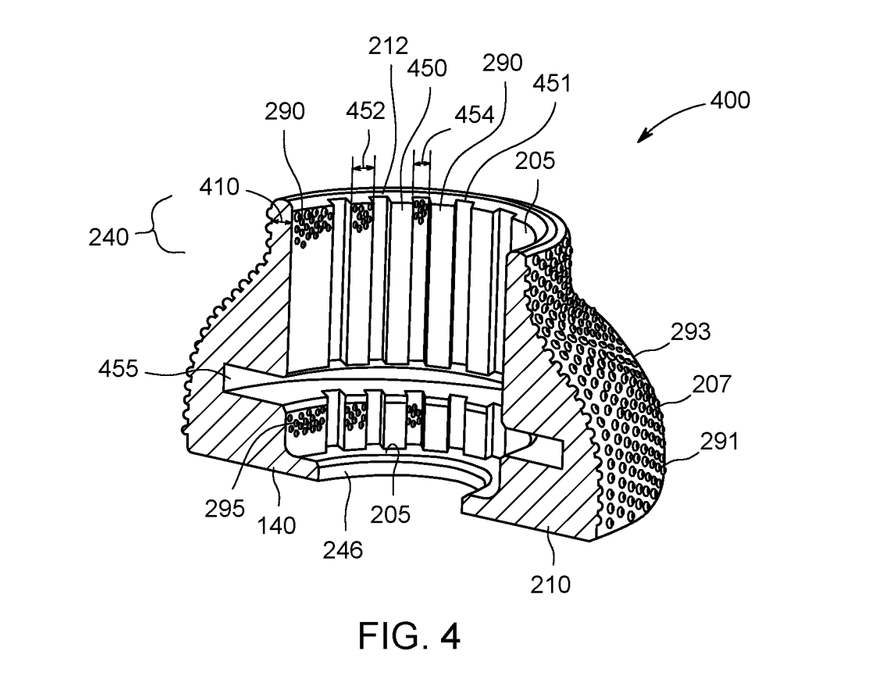
FIG. 4 depicts an isometric cross-sectional view of a coil spacer in accordance with some embodiments of the present disclosure.
Figure 5:
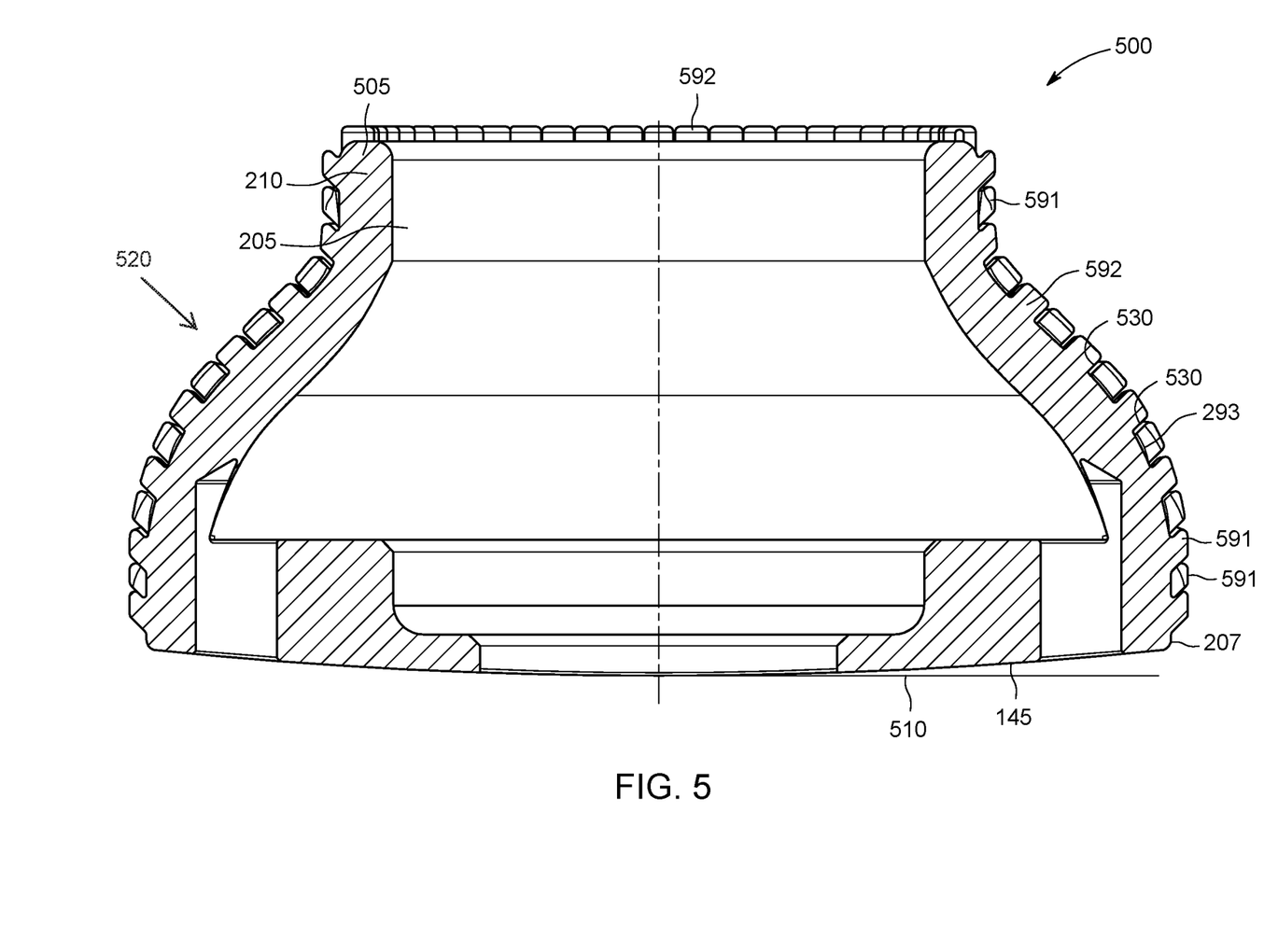
FIG. 5 is a schematic side view of a coil spacer in accordance with some embodiments of the present disclosure.
Figure 6:
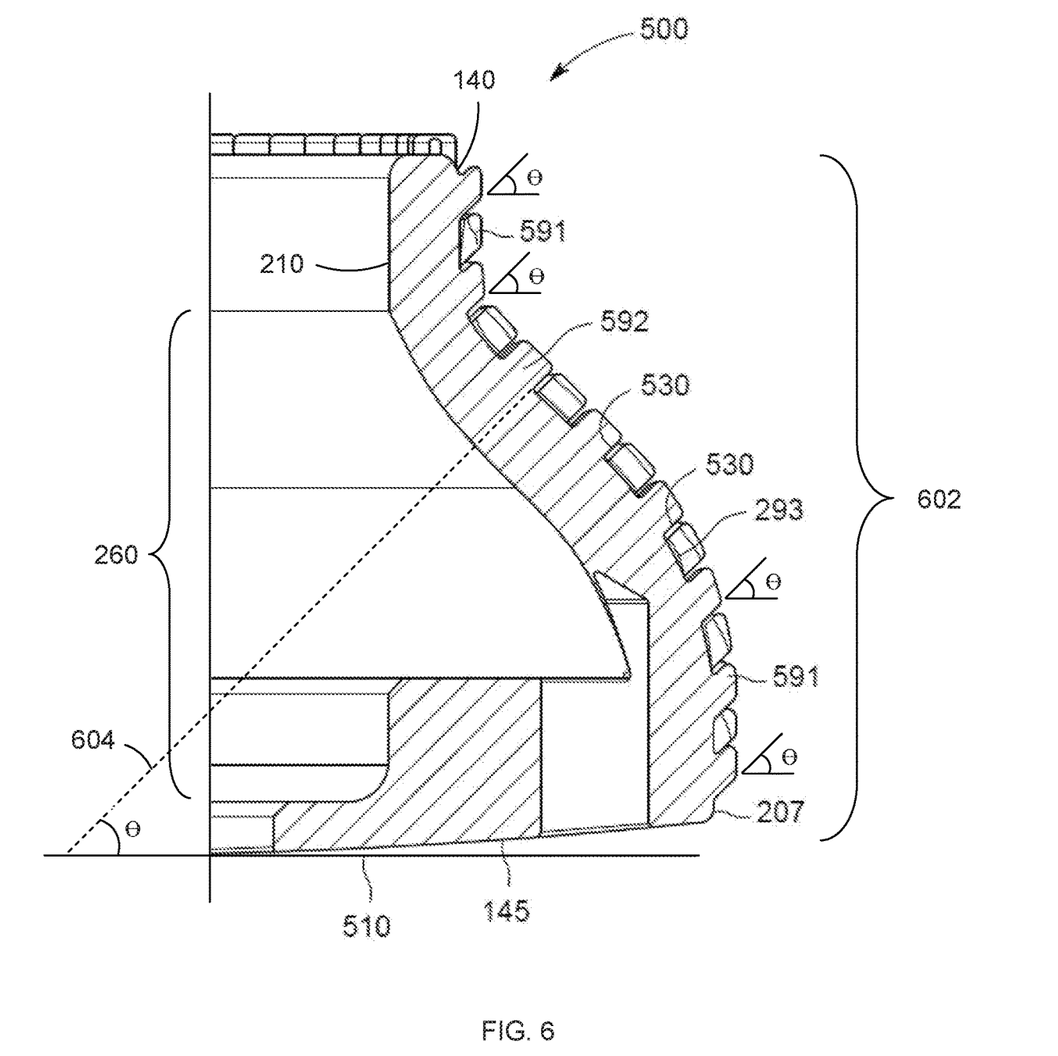
FIG. 6 is a partial schematic side view of the coil spacer showing features in accordance with the present disclosure.

In embodiments, the coil spacer 110 may have surfaces and a plurality of independent surface features in accordance with the present disclosure (as depicted in greater detail in FIGS. 2-6) configured to promote adhesion and minimize flaking of deposited material during operation of a processing chamber. For example, although not visible in FIG. 1, coil spacer 110 may include at least one textured surface region, wherein the at least one textured surface region includes a plurality of independent surface features having a first side having at least a 45 degree angle with respect to the base plane. FIGS. 2-6 illustrate various embodiments of chamber components for a processing chamber such as coil spacers 200, 300, 400, and 500 configured to inhibit flaking of deposited material. FIG. 2 depicts a cross-sectional view of one embodiment of a chamber component illustrated as a coil spacer 200. FIG. 3 depicts a cross-sectional view of one embodiment of a chamber component illustrated as a coil spacer 300. FIG. 4 depicts a cross-sectional view of yet another embodiment of a chamber component illustrated as a coil spacer 400. FIG. 5 a schematic side view of a coil spacer 500 in accordance with some additional embodiments of the present disclosure. FIG. 6 is a partial schematic side view of the coil spacer 500 in accordance with embodiments of the present disclosure.

As shown in FIGS. 2-6, the coil spacers 200, 300, 400, and 500 have a body 210. The body 210 may be of unitary construction, such as that from 3D printing, and have an interior surface 205 and an exterior surface 207. The interior surface 205 is disposed adjacent the opening 290. The interior surface 205 and exterior surface 207 may be spaced apart to form an outer lip 212 at the top portion 240 the coil spacers 200, 300, 400. The outer lip 212 may be configured to rigidly support the inductive coil 170 (shown in FIG. 1A) with minimal stress. The outer lip 212 may be sized to promote heat dissipation. For example, a larger, e.g., thicker, outer lip 212 has more mass and dissipates heat better than a thinner lip. The outer lip 212 may have a thickness 215 (FIG. 2) between about 2 mm and about 8 mm, such as about 5 mm, for better thermal performance. Although the coil spacers 200, 300, 400, and 500 may operate in the processing chamber under similar conditions and at similar temperatures, the maximum operating temperature of each coil spacer 200, 300, 400, and 500 is influenced properties and geometry of the coil spacers 200, 300, 400, and 500 such as shape and thickness of the outer lip 212 or the inclusion of features such as protrusions disposed atop the outer lip. The coil spacer of one embodiment may have maximum temperatures exceeding that of the coil spacer from other embodiments when used in the same processes chamber under the same temperature process.

The coil spacers 200, 300, 400, and 500 may have substantially the same surface area on the exterior surface 207. For example, the exterior surface 207 may have a surface area of between about 9.0 square inches (in$^2$) to about 9.5 in$^2$. In one embodiment, the coil spacers 200, 300, 400, and 500 have a surface area on the exterior surface of about 4.2388 in$^2$. Other parameters such as volume and weight may be substantially different for the coil spacers 200, 300, 400, and 500 and will be discussed individually with each embodiment of the coil spacers 200, 300, 400, and 500 below.

Although the coil spacers 200 is shown symmetrical about a central axis, or centerline 245, coil spacers 200, 300, 400, and 500 may be irregular in shape or asymmetrical. The opening 290 of the coil spacers 200, 300, 400, and 500 extend through the top portion 240 of the coil spacers. In one embodiment, the opening 290 may be described by a cylindrical projection (only shown by dashed lines 276 in FIG. 2) about the centerline 245. The opening 290 extends through the coil spacers 200, 300, 400, and 500 from an outer lip 212 proximate the top portion 240 and disposed between the exterior surface 207 and the interior surface 205 to an inner lip 271. The inner lip 271 extends toward the centerline 245 to a bottom opening 246 in the coil spacers 200 as shown in FIG. 2. The bottom opening 246 may be configured to interface with the inner shield 150 (FIG. 1B) of a processing chamber such as a PVD processing chamber. The bottom opening 246 may also be configured to provide electrical or other connections between the processing chamber (not shown) and an inductive coil 170 (FIG. 1B). For example, the inductive coil 170 (FIG. 1B) may have power leads which pass through the bottom opening 246 to the RF power source (not shown) for energizing the inductive coil.

The exterior surface 207 of a component part body 293 may have at least one textured surface region 295 (see, e.g., FIG. 2), wherein the at least one textured surface region 295 includes a plurality of independent surface features 291. In embodiments, independent surface features 291, 591 protrude axially from the component part body 293 (see, e.g., FIGS. 2, 5, and 6) and are equally spaced around periphery of the component part body 293. In embodiments, the component part body 293 includes at least two textured surface regions 295. Surface features 291, 591 formed independently on component part body such as 293 promote adhesion to the coil spacers 200, 300, 400, and 500. Similarly, the interior surface 205 may have surface features 291 formed thereon. The surface features 291 formed on the surfaces 205, 207 may be substantially similar. The surface features 291 formed on the surface 205, 207 may be repetitive predetermined pattern of projections that creates an engineered surface structure that interrupts the macro-level surface contour of the surface 205, 207 to promote film adhesion of deposited materials. Alternately, the geometry of the surface features 291 may differ on different the surfaces 205, 207 and/or across one or more of the surfaces 205, 207. In one embodiment, as described further below, the cup region 260 disposed between the top portion 240 and bottom portion 145, wherein the cup region 260 has an exterior surface 207 including at least one textured surface region 295. The at least one textured surface region 295 includes a plurality of independent surface features having a first side having at least a 45 degree angle with respect to the bottom portion 145. In embodiments, the surface features 291 may be formed in localized patterns such that the pattern of surface features 291 may be different on the outer lip 212 and cup region 260. The surface features 291, 591 may provide a macro-textured area which promotes adhesion of deposition materials. During plasma processing, deposition materials may readily adhere to the surface features 291, 591 formed on the exterior surface 207. The deposition materials may readily adhere to the surface features 291 formed on the interior surface 205 of the coil spacer 200 as well. The surface features 291, 591 may additionally be configured to increase the surface area of the coil spacers 200, 300, 400, and 500. The increased surface area helps increase the film adhesion during processing. Thus, the surface features 291, 591 promote adhesion and mitigate flaking off of the adhered material and possibly contaminating the processing chamber.

As described further below, the surface features 291, 591 may be protrusions formed during the 3D printing process. The surface features 291, 591 may be a texture such as a pattern of small cylindrical protrusions or the like, or other suitable textures for enhancing film adhesion. In embodiments, the independent surface features 291, 591 may be printed on the exterior surface of the coil spacer 200, 300, 400, and 500 as well.

Turning back to FIG. 2, the coil spacer 200 has a void 254 extending beyond the opening 290. The void 254 is interior and extends from the dashed lines 276 to a lower portion 273 of the interior surface 205. The void 254 is bounded by a bottom surface 252 coil spacer 200 which extends from a protrusion 280 proximate the inner lip 271 to the lower portion 273 of the interior surface 205. The protrusion 280 has a top surface 282, an inner surface 281 and an outer surface 283. The outer surface 283 is proximate the bottom surface 252. The inner surface 281 may be significantly aligned with the inner surface 272 such that inner surfaces 272, 281 are aligned with the cylindrical projection illustrated by dashed lines 276. The top surface 282, inner surface 281 and outer surface 283 may have surface features 291 formed thereon to promote adhesion of deposited films.

The body 210 of the coil spacer 200 has a wall 287. The wall 287 has a thickness defined by the distance between the interior surface 205 and the exterior surface 207 of the wall 287. In one embodiment, the thickness of the wall 287 is substantially uniform. That is, a thickness 215 of the outer lip 212 is substantially the same throughout the profile of the wall 287 of the coil spacer 200. In another embodiment, the wall 287 has a thickness which is not uniform. For example, the thickness 215 of the outer lip 212 may be greater than a thickness 225 at the cup region 260 of the wall 287.

In one embodiment, the body 210 of the coil spacer 200 may be formed from stainless steel or other suitable material. The coil spacer 200 may be configured to promote thermal uniformity and thus reduce stress in material adhered to the coil spacer 200, which desirably mitigates flaking of the adhered material. The thermal mass and heat dissipating properties of the coil spacer 200 may reduce the thermal gradients between the top portion 240 and the bottom portion 145 of the coil spacer 200. Some embodiments of FIG. 2 include a plurality of independent surface features 291 having a first side having at least a 45 degree angle with respect to a base plane, for example as shown in FIGS. 5 and 6 below. In FIG. 2, the base plane is shown as axis X' 208 and axis Z' 209.

Turning to FIG. 3, the coil spacer 300 has a cavity 345 extending beyond the opening 290. The cavity 345 may have top surface 361, a bottom surface 362 and an inner wall 363. The top surface 361 and the bottom surface 362 may have a depth 347 defined by the distance of the top and bottom surfaces 361, 362 from the inner wall 363 to the opening 290. The inner wall 363 may have a height 346 defined by the distance between the top surface 361 and the bottom surface 362. The top surface 361 and bottom surface 362 along with the inner wall 363 substantially describe the extent of the cavity 345. In one embodiment, the cavity 345 has a substantially rectangular side profile. In another embodiment, the cavity 345 may have a triangular side profile wherein the top surface 361 and the bottom surface 362 intersect and there is no inner wall 363.

The component part body of the coil spacer 300 may be formed from stainless steel or other suitable material. The coil spacer 300 may be formed by additive manufacturing with surface features 291 formed thereon to promote adhesion of deposited material. Some embodiments of FIG. 3 include a plurality of independent surface features 291 having a first side having at least a 45 degree angle with respect to a base plane, for example as shown in FIGS. 5 and 6 below.

Turning to FIG. 4, the coil spacer 400 has fins 450. Troughs 451 are defined between the fins 450. The fins 450 may have a width 452 which may be tuned to achieve a desired rate of heat transfer. The troughs 451 may have a width 454 determined by the number of fins 450 and the width 452 of the fins. In one embodiment, the coil spacer 400 may have 8 equally spaced fins 450. Alternately, the coil spacer 400 may have between about 4 and 18 equally spaced fins 450, such as 12 fins or 8 fins. The coil spacer 400 may additionally have a flange wall thickness 410 near the inductive coil (not shown) of between about 2 mm to about 8 mm, such as about 5 mm. The fins 450 and flange wall thickness 410 help reduce the temperature differential across the coil spacer 400. The fins 450 for the coil spacer 400 conduct heat away faster, thus allowing the coil spacer 400 to be maintained at lower temperature compared to the coil spacer 300 without fins. The width 452 of the fins 450 plays a role in reducing the temperature of the coil spacer 400. For example, a cup having 8 fins 450 having the width 452 of about 2 mm may have temperature slightly higher than a cup having 8 fins 450 having the width 452 of about 3 mm. Thus, increasing the width 452 of the fins 450 may reduce the temperature experienced by the coil spacer 400 during operation of the processing chamber. As shown in FIG. 4, the coil spacer may include an interior surface having a plurality of fins 450, e.g. heat transfer fins, and an exterior surface 207 on which the at least one textured surface region is formed.

The coil spacer 400 may be formed by printing, such as 3D printing, from a stainless steel or other suitable material. The stainless steel material for the coil spacer 400 permits the coil spacer 400 to experience temperatures well in excess of the maximum temperature the coil spacer 400 experiences during operation. The coil spacer 400 may have two or more fasteners to hold the coil spacer 400 in place on the inner shield. The number of fasteners may be increased to improve thermal conductivity between the coil spacer 400 and inner shield.

In one embodiment, the coil spacer 400 has 8 fins and a flange wall thickness 410 of about 5 mm. The coil spacer 400 may be formed by additive manufacturing with the surface features 291 formed on the surfaces, including the fins 450, troughs 451, and void 455 to promote adhesion of deposited material. The coil spacer 400 may be configured to promote thermal uniformity and thus reduce stress and mitigate flaking of adhered material.

Some embodiments of FIG. 4 include a plurality of independent surface features 291 having a first side having at least a 45 degree angle with respect to a base plane, for example as shown in FIGS. 5 and 6 below as with respect to independent surface features 591.

Referring now to FIG. 5, a cross-sectional view of a coil spacer 500 in accordance with some embodiments of the present disclosure is shown. Component part body 505 is shown having a base plane 510 and at least one textured surface region 520. However, in embodiments, the component part body 505 may include at least two textured surface regions (not shown in FIG. 5). The at least one textured surface region 520 includes a plurality of independent surface features 591 having a first side 530 having at least a 45 degree angle with respect to the base plane 510. In embodiments, the plurality of independent surface features 591 protrude axially from the component part body 505 and are equally spaced around periphery of the component part body 505. In embodiments, the independent surface features 591 are equally sized and equally spaced cylindrical protrusions.

In embodiments, the plurality of independent surface features 591 include protrusions 592 having a predetermined diameter. Non-limiting suitable diameters of protrusions in accordance with the present disclosure include protrusions 592 having a diameter of about 1.1 to about 1.8 millimeters, or about 1.40 millimeters, or 1.40 millimeters. In embodiments, an independent surface feature 591 is the same structure as a protrusion 592.

In embodiments, the plurality of independent surface features 591 include protrusions 592 having a predetermined height. Non-limiting suitable heights of protrusions 592 in accordance with the present disclosure include protrusions 592 having a height of about 0.70 to 1.30 millimeters, or about 1.00 millimeters, or 1.00 millimeters.

In embodiments, the plurality of independent surface features 591 include protrusions 592 having a predetermined spacing on the component part body 505. Non-limiting suitable spacing of protrusions 592 in accordance with the present disclosure include protrusions 592 having a spacing of about 0.70 to about 1.30 millimeters, or about 1.00 millimeters, or 1.00 millimeters. Spacing may be measured for example by measuring from the edge of a first protrusion 592 to the edge of a second protrusion 592 immediately adjacent the first protrusion. In embodiments, each feature has a center, and each center is about 1.3 to about 2.5 millimeters from any adjacent feature, or in some embodiments, about 2.2 millimeters.

Still referring to FIG. 5, protrusions 592 include cylindrical shaped protrusions having a substantially flat top surface. In embodiments, the plurality of independent surface features 591 have an upper fillet radius of about 0.25 millimeters. In embodiments, the plurality of independent surface features 591 have a bottom fillet radius of about 0.10 millimeters. In embodiments, the plurality of independent surface features 591 include a predetermined repetitive pattern of cylindrical protrusions 592. In embodiments, the at least one textured surface region 520 includes a predetermined repetitive pattern of spaces between the plurality of independent surface features 591.

The coil spacer 500 may be formed by printing, such as 3D printing, from a stainless steel or other suitable material. The stainless steel material for the coil spacer 500 permits the coil spacer 500 to experience temperatures well in excess of the maximum temperature the coil spacer 500 experiences during operation.

Following completion of the additive processes of the method of the present disclosure, the method produces a coil spacer 110, 200, 300, 400, or 500 including a plurality of independent surface features such as 291 and 591 that are free of pores and inclusions. The plurality of independent surface features such as 291 and 591 are substantially homogenous and include a substantially unitary crystal structure among the materials used to produce the plurality of independent surface features. In embodiments, the plurality of independent surface features are substantially free of pores and inclusions among each adjacent deposited layer. In embodiments, the plurality of independent surface features are substantially pore free, such as below about 1%, about 0.5% or below about 0.5% upon inspection at the completion of the additive process. In embodiments, inspection is performed by forming a cross sectional cut along the surface of the component or coil spacer (at least 3 to 5 millimeters from the surface thereof and visually inspecting the cross section with the use of an optical microscope).

FIG. 6 is a partial schematic side view of a coil spacer 500 as disclosed in FIG. 5, more clearly showing the plurality of features in accordance with some embodiments of the present disclosure. Here, body 210 is shown having a base plane 510 and at least one textured surface region. The at least one textured surface region includes a plurality of independent surface features 591 having a first side 530 having at least a 45 degree angle with respect to the base plane 510. In embodiments, the plurality of independent surface features 591 protrude axially from the body 210 and are equally spaced around periphery of the body 210.

A cup region 260 is shown disposed between the top portion 140 and bottom portion 145, wherein the cup region 260 has an exterior surface 207. At least one textured surface region is disposed upon at least portions of the exterior surface 207 of the cup region 260 (e.g., an exterior portion 602 of the cup region 260). The at least one textured surface region may be any region as discussed above with respect to any other embodiments disclosed herein. The at least one textured surface region includes a plurality of independent surface features 591 having a first side 530 having at least a 45 degree angle with respect to the base plane 510. Base plane 510 generally extends as a plane across bottom portion 145. Dotted lines 604 show the angle of first side 530 in relation to the base plane 510. In embodiments, the angle of first side 530 in relation to the base plane 510 is greater than or equal to 45 degrees, such as between about 85 degrees and 45 degrees, or between about 75 degrees and 45 degrees, or between about 65 degrees and 45 degrees, or between about 55 degrees and 45 degrees, or between about 50 degrees and 45 degrees, or about 45 degrees, or 45 degrees. In embodiments, the downskin (e.g., the downwardly facing surfaces of the independent surface features 591) of the first side 530 is formed to be substantially pore free or having a porosity of less than 1% or less than 0.5% as described above.

Additive Manufacturing 3D printing is a technique of manufacturing three dimensional components by laying down successive thin layers of material. 3D Printing is also used in the semiconductor industry for manufacturing semiconductor processing chamber components (such as coil spacers) for plasma deposition chambers that can provide improved adhesion of deposition material on the surface of the chamber component. In a 3D printing processes of the present disclosure, a thin layer of precursor, e.g., a metal powder or other feed stock material is progressively deposited and fused to form a full 3-dimensional component of the chamber. In embodiments, a precursor material is preselected to reduce or eliminate porosity of the chamber component. In embodiments, the chamber component precursor material is stainless steel metal powder. In embodiments, the stainless steel metal powder has a powder size characterized as 35-45 micrometers.

In some embodiments, suitable techniques for 3D printing the coil spacers 110, 200, 300, 400, and 500 include 3D printing using selective laser sintering. A laser or other suitable power such as around a 244 W source sinters powdered material, such as 35 to 40 micrometer stainless steel powder, by aiming the laser automatically at points in the powder defined by a 3D model. The laser binds the material together to create a solid structure such as a one-piece structure. When a layer is finished, the build platform moves downward and a new layer of material is sintered to form the next cross section (or layer) of the coil spacers 110, 200, 300, 400, and 500. Repeating the aforementioned process builds up the coil spacers 110, 200, 300, 400, and 500 one layer at a time. In embodiments, where a porosity of the coil spacer, feature, or first surface of the feature are substantially pore-free (e.g. porosity <1% or <0.5%) the first several layers may be sacrificial up to about 500 micrometers. When layered to 500 micrometers, about 40 micrometer layers are successively added to reduce the porosity of the component. The inventors have discovered that by preselecting the size of the powder, and providing a predetermined thickness of the layers, above the first 500 micrometers of layering, a laser may be applied at around 244 W to reduce or eliminate pore formation in the coil spacer, feature, or surface edge of the feature. Printing processes may exclude the use of additional supports that may contribute to problematic roughness in the downskin. In embodiments, a high speed steel hard recoater blade is selected to ensure the homogenous size of the precursor powder such as 35-45 micrometer stainless steel powder.

Figure 7:
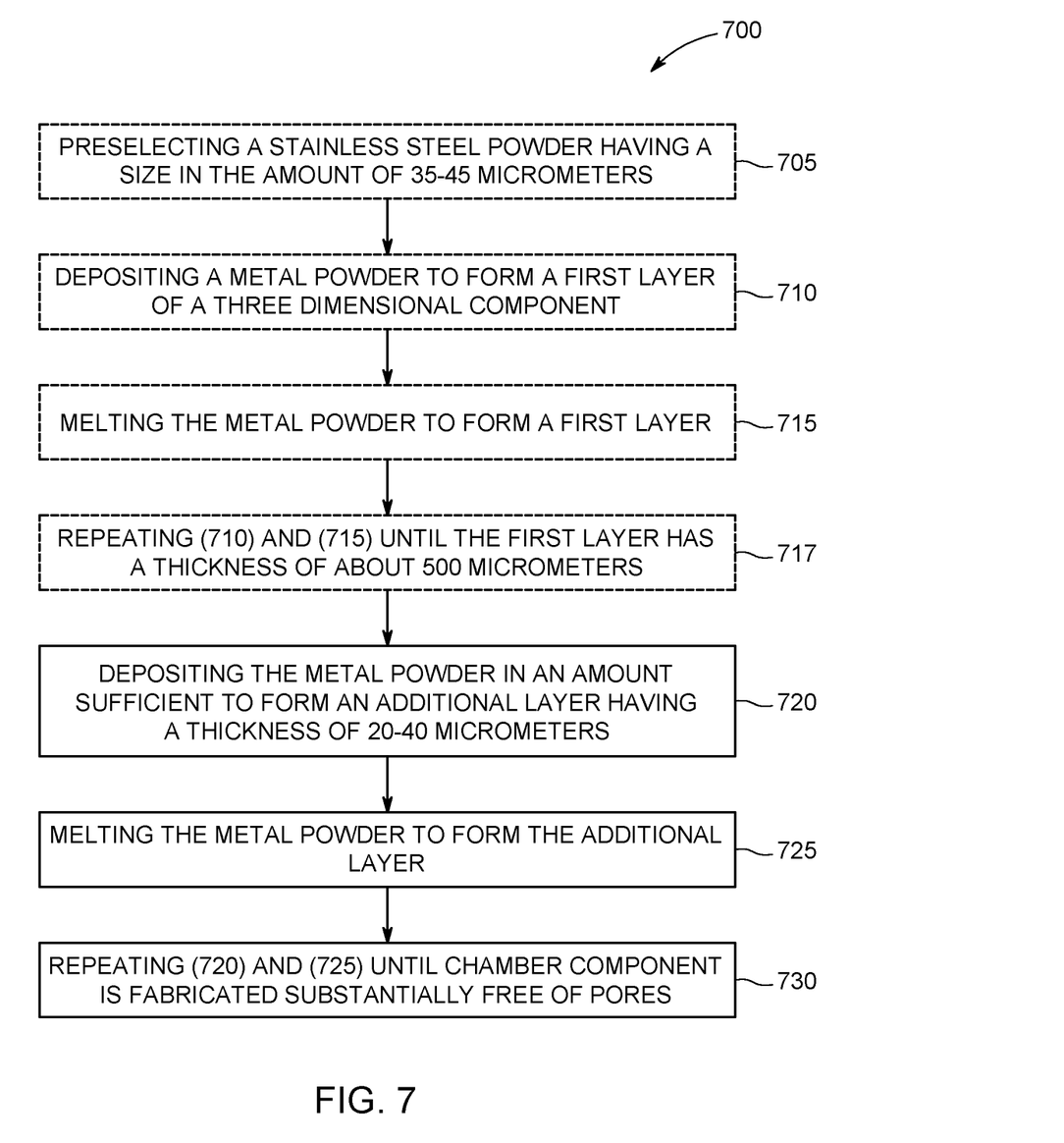
FIG. 7 is a flow chart of a manufacturing process in accordance with some embodiments of the present disclosure.

Referring now to FIG. 7, a schematic view of a manufacturing process 700 in accordance with one manufacturing embodiment is shown. In embodiments, a method of reducing or eliminating pores in a three dimensional printed chamber component includes at 705 optionally preselecting a stainless steel powder having a size in the amount of 35 to 45 micrometer. In embodiments, process 700 optionally starts at 710 with depositing a metal powder to form a first layer of a three dimensional component. Next at 715, process 700 includes melting the metal powder to form a first layer. At 717, 710 and 715 are repeated until the first layer has a thickness of about 500 micrometers. After reaching a thickness of about 500 micrometers, the process 700 continues with 720 by depositing the metal powder in an amount sufficient to form an additional layer having a thickness of 20-40 micrometers. At 725, process 700 continues by melting the metal powder to form the additional layer. At 730, the process continues by repeating 720 and 725 until chamber component is fabricated substantially free of pores.

In embodiments, a component, a coil spacer, a feature, and/or the outer down skin portion of the feature are 3D printed to be substantially free of pores such that a porosity less than or equal to 1% or 0.5% may be advantageously provided. In embodiments, the methods of the present disclosure include using a precursor such as a metal powder or stainless steel powder having a particle size distribution in the amount of 35-45 micrometers. In embodiments, the particle size distribution is such that the majority of particles have a diameter in the amount of about 35-45 micrometers. In embodiments, the stainless steel powder has a spherical nature. In embodiments, stainless steel powder is substantially pure such as having a purity of 99.9%.

While the foregoing is directed to embodiments of the present disclosure, other and further embodiments of the disclosure may be devised without departing from the basic scope thereof.

The invention claimed is:

1. A chamber component for a processing chamber, comprising:
a coil spacer for a processing chamber having a base plane and at least one textured surface region perpendicular to the base plane,
wherein the at least one textured surface region comprises a plurality of independent surface features extending axially outward from and equally spaced on an external surface of the coil spacer and having a first side with a linear edge closest to the base plane that forms at least a 45 degree to approximately 75 degree angle with respect to the base plane, and wherein the base plane is configured to be parallel to an outer vertical shield of a process volume of a plasma vapor deposition (PVD) chamber when the coil spacer is installed in the PVD chamber,
wherein the at least one textured surface region of the coil spacer is a curved surface connecting a wider base plane to a narrower top plane and the independent surface features all have their first side linear edge parallel to each other and all forming an angle between 45 to approximately 75 degrees with the base plane.

2. The chamber component of claim 1, wherein the first side is a downwardly facing surface towards the base plane and wherein only the first side is porous and has a porosity of greater than zero and less than approximately one percent.

3. The chamber component of claim 1, wherein the plurality of independent surface features comprise protrusions having a diameter of about 1.1 to about 1.8 millimeters.

4. The chamber component of claim 1, wherein the plurality of independent surface features comprise protrusions having a heights of about 0.70 to about 1.30 millimeters.

5. The chamber component of claim 1, wherein the plurality of independent surface features comprise protrusions spaced upon the coil spacer by about 0.70 to about 1.30 millimeters.

6. The chamber component of claim 1, wherein each feature of the plurality of independent surface features has a center, and each center is about 1.3 to about 2.5 millimeters from any adjacent feature.

7. The chamber component of claim 1, wherein the plurality of independent surface features include a predetermined repetitive pattern of cylindrical protrusions.

8. The chamber component of claim 1, wherein the independent surface features are equally sized and equally spaced cylindrical protrusions.

9. The chamber component of claim 1, wherein the independent surface features have a flat top.

10. The chamber component of claim 1, wherein the coil spacer comprises at least two textured surface regions.

11. The chamber component of claim 1, further comprises:
an interior surface having a plurality of heat transfer fins; and an exterior surface on which the at least one textured surface region is formed.

12. A coil spacer for a processing chamber, comprising:
a top portion;
a bottom portion;
an opening disposed in the top portion and extending through the bottom portion, wherein the top portion is configured to receive a tab of an inductive coil of a plasma vapor deposition (PVD) chamber and wherein the bottom portion is configured to receive a tab receptor for the inductive coil of the PVD chamber;
an exterior surface;
an interior surface disposed adjacent the opening; and
a cup region disposed between the top portion and bottom portion, wherein the cup region has an exterior portion, wherein at least one textured surface region is perpendicular to a base plane of the coil spacer and is disposed upon the exterior portion of the cup region, wherein the at least one textured surface region comprises a plurality of independent surface features extending axially outward from and equally spaced on the exterior surface and having a first side with a linear edge closest to the base plane that forms at least a 45 degree to approximately 75 degree angle with respect to the base plane, wherein the base plane extends as a plane across the bottom portion, and wherein the base plane is configured to be parallel to an outer vertical shield of a process volume of the PVD chamber when the coil spacer is installed in the PVD chamber,
wherein the at least one textured surface region of the coil spacer is a curved surface connecting a wider bottom portion to a narrower top portion and the independent surface features all have their first side linear edge parallel to each other and all forming an angle between 45 to approximately 75 degrees with the base plane.

13. The coil spacer of claim 12, wherein each of the plurality of independent surface features has an upper fillet radius of approximately 0.25 millimeters and a bottom fillet radius of approximately 0.10 mm.

14. The coil spacer of claim 12, wherein the first side is a downwardly facing surface towards the base plane and wherein only the first side is porous and has a porosity of greater than zero and less than approximately one percent.

15. The coil spacer of claim 12, wherein a top portion is disposed adjacent the cup region, wherein the top portion comprises a plurality of features.

16. The coil spacer of claim 12, comprising an outer lip proximate the top portion and disposed between the exterior surface and the interior surface.

17. The coil spacer of claim 12 made by:
    (a) depositing a metal powder in an amount sufficient to form a layer having a thickness of 20-40 micrometers;
    (b) melting the metal powder to form a layer; and
    (c) repeating (a) and (b) until chamber component is fabricated substantially free of pores.

18. The coil spacer of claim 17,
    wherein the metal powder is stainless steel powder having a size in an amount of 35-45 micrometers.

* * * * *